US008045334B2

(12) United States Patent  
Donners

(10) Patent No.: US 8,045,334 B2  
(45) Date of Patent: Oct. 25, 2011

(54) COMPONENT ADAPTED FOR BEING MOUNTED ON A SUBSTRATE AND A METHOD OF MOUNTING A SURFACE MOUNTED DEVICE

(75) Inventor: Maurice Alexander Hugo Donners, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 733 days.

(21) Appl. No.: 12/090,884

(22) PCT Filed: Oct. 13, 2006

(86) PCT No.: PCT/IB2006/053768  
§ 371 (c)(1), (2), (4) Date: Aug. 22, 2008

(87) PCT Pub. No.: WO2007/046045  
PCT Pub. Date: Apr. 26, 2007

(65) Prior Publication Data  
US 2008/0314624 A1 Dec. 25, 2008

(30) Foreign Application Priority Data  
Oct. 21, 2005 (EP) ..................... 05109811

(51) Int. Cl.  
*H05K 7/00* (2006.01)  
*H05K 7/10* (2006.01)  
*H05K 1/03* (2006.01)

(52) U.S. Cl. ......... 361/767; 361/760; 361/768; 174/255

(58) Field of Classification Search ................ None  
See application file for complete search history.

(56) References Cited

U.S. PATENT DOCUMENTS 5,277,612 A * 1/1994 Windham et al. ............. 439/326  
2010/0327768 A1 * 12/2010 Kong et al. .................... 315/294

FOREIGN PATENT DOCUMENTS

| EP | 1345274 A2 | 9/2003 |
| EP | 1519145 A1 | 3/2005 |
| EP | 1548354 A2 | 6/2005 |
| JP | 05042718 A | 2/1993 |
| JP | 07015021 A | 1/1995 |
| JP | 2001094146 A | 4/2001 |
| JP | 2002329893 A | 11/2002 |
| JP | 2003264299 A | 9/2003 |
| JP | 2004146571 A | 5/2004 |

* cited by examiner

*Primary Examiner* — Boris Chervinsky

(57) ABSTRACT

A supporting component (1) adapted for being mounted on a substrate (11) and for serving as a support for a surface mounted device (15) comprises a body (2) having a first surface (3) adapted for being mounted on the substrate (11), and a second surface (4) being adapted for supporting the surface mounted device (15). The second surface (4) is inclined in relation to the first surface (3). The supporting component (1) further comprises a first supporting component conductor (6) adapted for forming an electrical contact between a first substrate conductor (12) of the substrate (11) and a first electrode (16) of the surface mounted device (15). In a method of mounting a surface mounted device (15) in an inclined manner on a substrate (11) the supporting component (1) is mounted on the substrate (11) with the surface mounted device (15) on top of it.

12 Claims, 4 Drawing Sheets

IV-IV

COMPONENT ADAPTED FOR BEING MOUNTED ON A SUBSTRATE AND A METHOD OF MOUNTING A SURFACE MOUNTED DEVICE

The present invention relates to a supporting component adapted for being mounted on a substrate and for serving as a support for a surface mounted device. The present invention also relates to a method of mounting a surface mounted device on a substrate.

Surface mounted devices (SMD's), such as light-emitting diodes (LED's), photo-diodes, resistors etc. are adapted for being mounted to a surface of substrate, such as a printed circuit board (PCB). For mass production it is important that mounting of the SMD to the substrate can be made in a quick and automatic manner.

In some cases there is a need for mounting surface mounted devices on a substrate with a certain inclination. It could, for example, be necessary to mount a LED chip with a certain inclination to the substrate in order to direct the light emitted in a certain direction.

JP 2003-264299 describes a stand made from bent metal plate. The stand is able to function as a support for a LED in order to have it inclined in relation to the support. The LED has a plate which isolates it from the stand.

A problem with the LED supported by the inclined stand described in JP 2003-264299 is that it is not easy to mount on the substrate. Thus mounting becomes more or less manual which increases mounting costs.

An object of the present invention is to provide a supporting component which makes it possible to mount a surface mounted device inclined on a substrate in an efficient way.

This object is achieved by a supporting component adapted for being mounted on a substrate and for serving as a support for a surface mounted device, the supporting component comprising a body having a first surface adapted for being mounted on the substrate, and a second surface being adapted for supporting the surface mounted device, the second surface being inclined in relation to the first surface, the supporting component further comprising a first supporting component conductor adapted for forming an electrical contact between a first substrate conductor of the substrate and a first electrode of the surface mounted device.

An advantage of this supporting component is that it provides an inclined support for the surface mounted device (SMD) providing for a desired inclination of the SMD in relation to the substrate, and, additionally, a conductor that provides contact between the substrate and at least one electrode of the SMD. This provides for simple automatic mounting in a manner which is well adapted for mass production.

An advantage with the measure according to claim 2 is that two electrodes of the SMD can be contacted with the substrate via the supporting component. Thereby the mounting of the SMD, inclined in relation to the substrate, provides for simultaneous connection to the conductors of the substrate. This provides for a quick mounting with few working operations.

An advantage of the measure of claim 3 is that it provides an efficient way of locating two electrodes, that are isolated from each other, on the supporting component.

An advantage of the measure of claim 4 is that a core of an isolating material onto which the conductors have been formed gives the supporting component a simple design which is easy to manufacture.

An advantage of the measure according to claim 5 is that a ceramic core often has a suitable thermal conductivity which avoids problems related to heat emission from the SMD that is supported by the supporting component. Further ceramic materials are often isolating which makes it easier to keep two or more supporting component conductors isolated from each other.

An advantage of the measure according to claim 6 is that a metal core in the supporting component provides the added feature of effective heat transport from the SMD to the substrate on which the supporting component is mounted.

An advantage of claim 7 is that forming the conductor by means of structured metallisation provides a simple manufacturing technique for forming a supporting component having at least one conductor.

An advantage of claim 8 is that it provides for simple mounting on the substrate by means of pick-and-place devices.

Another object of the present invention is to provide an efficient method of mounting a surface mounted device inclined on a substrate.

This object is achieved by a method of mounting a surface mounted device on a substrate, the method comprising providing a supporting component comprising a body having a first surface and a second surface, the second surface being inclined in relation to the first surface, the supporting component further comprising a first supporting component conductor adapted for forming an electrical contact between a first substrate conductor of the substrate and a first electrode of the surface mounted device, and applying, in optional order, a) the supporting component on the substrate with the first surface of the supporting component facing the substrate and with the first supporting component conductor in contact with the first substrate conductor, and b) the surface mounted device on the second surface of the supporting component and with the first supporting component conductor in contact with the first electrode of the surface mounted device.

An advantage of this method is that the surface mounted device (SMD) is supported by the supporting component which also provides for electrical contact between the SMD and the substrate. This makes the mounting of the SMD quicker compared to the prior art. As will be appreciated the step a) could be performed prior to step b), or, as alternative, step b) could be performed prior to step a). Thus the surface mounted device could be applied to the supporting component either after or before applying the supporting component on the substrate. This makes it possible to choose the best order of performing steps a) and b) depending on the conditions in the actual case.

An advantage of the measure according to claim 11 is that it is in many cases advantageous to first apply the surface mounted device on the supporting component to form a prefabricated package which is then mounted on the substrate in a single working operation.

An advantage of the measure according to claim 12 is that soldering, welding and gluing provides for fixing the supporting component to the substrate and to the SMD simultaneously with forming a good electrical contact from the substrate to the SMD.

Further embodiments and advantages of the invention will become apparent from the description below and the appended claims.

The invention will now be described in more detail with reference to the appended drawings in which.

Figure 1:
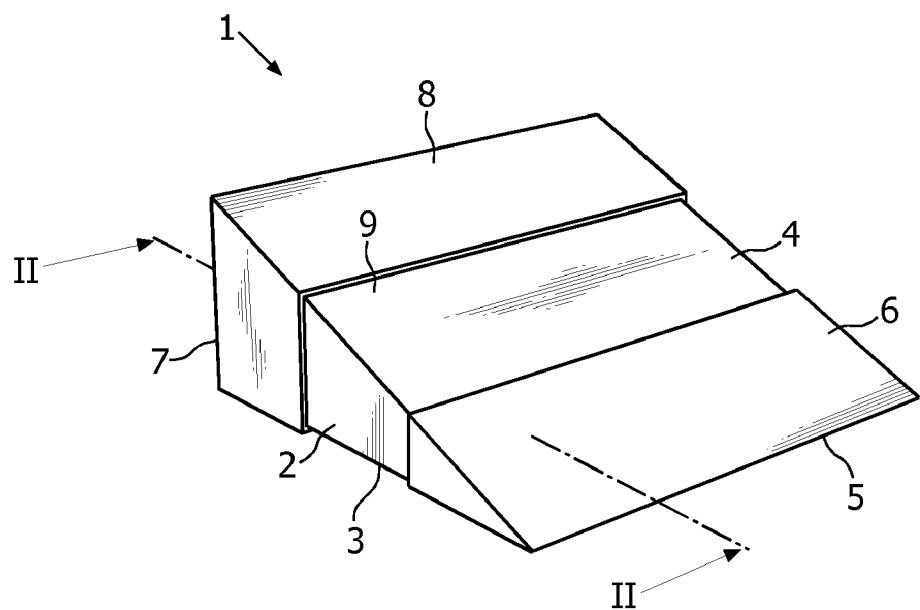
FIG. 1 is a perspective view and shows a supporting component according to one embodiment of the invention.

FIG. 1 shows a supporting component 1 according to one embodiment of the present invention. The component 1 has a body 2, which forms a core of the supporting component 1 and is made of an isolating material, preferably a technical ceramic, for example alumina, $Al_2O_3$. The body 2 is wedge-shaped and thus has a first surface 3 and a second surface 4 which is inclined in relation to the first surface 3. A tip 5 of the wedge-shaped body 2 is provided with a first supporting component conductor 6. The conductor 6 is preferably made of a metal, such as copper, Cu, aluminium, Al, gold, Au, or silver, Ag, which has a high conductivity. At the opposite side of the wedge-shaped body 2, i.e. at a thick end 7 of the wedge-shaped body 2, a second supporting component conductor 8 has been provided. This conductor 8 is also, preferably, made of a metal with a high conductivity. The body 2 has a portion 9 which, since the body 2 is made of an isolating material, isolates the first conductor 6 from the second conductor 8.

The body 2 can be formed by extrusion of the alumina according to principles that are per se known in the art of forming surface mounted devices (SMD's), such as ceramic resistors. The first and second conductors 6, 8 are then formed on the body 2 by a suitable process of providing a structured metallisation. Such processes are per se known and include, for example, vapour deposition and electroplating techniques. The portion 9, which has no metal coating, could be obtained by covering a part of the body 2 with a resist layer, by means of, for example, photolithography, prior to the metallisation step, or by using a shadow mask during deposition.

Figure 2:
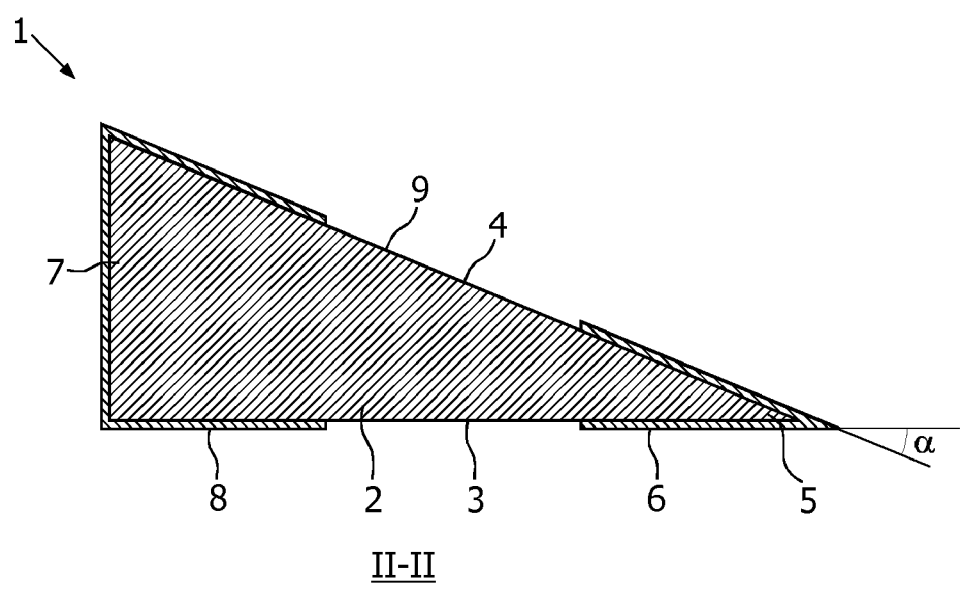
FIG. 2 is a cross-section view and shows the cross-section II-II indicated in FIG. 1.

FIG. 2 shows the supporting component 1 as seen in cross-section. As shown in FIG. 2 the body 2 forms a core onto which the conductors 6, 8 have been applied. It is clearly shown in FIG. 2 that the first conductor 6 "wraps" around the tip 5. Thus the first conductor 6 starts at the first surface 3, turns at the tip 5 and continues on the second surface 4. It is further shown that the second conductor 8 starts at the first surface 3, extends around the thick end 7 of the body 2 and continues on the second surface 4. Thus the first and second conductors 6, 8 provide for electrical contact between the first surface 3 and the second surface 4.

The angle α between the first surface 3 and the second surface 4 is about 20° as shown in FIG. 2. It will be appreciated that the angle α is preferably chosen in the range of about 1° to about 89° depending on the application.

Figure 3:
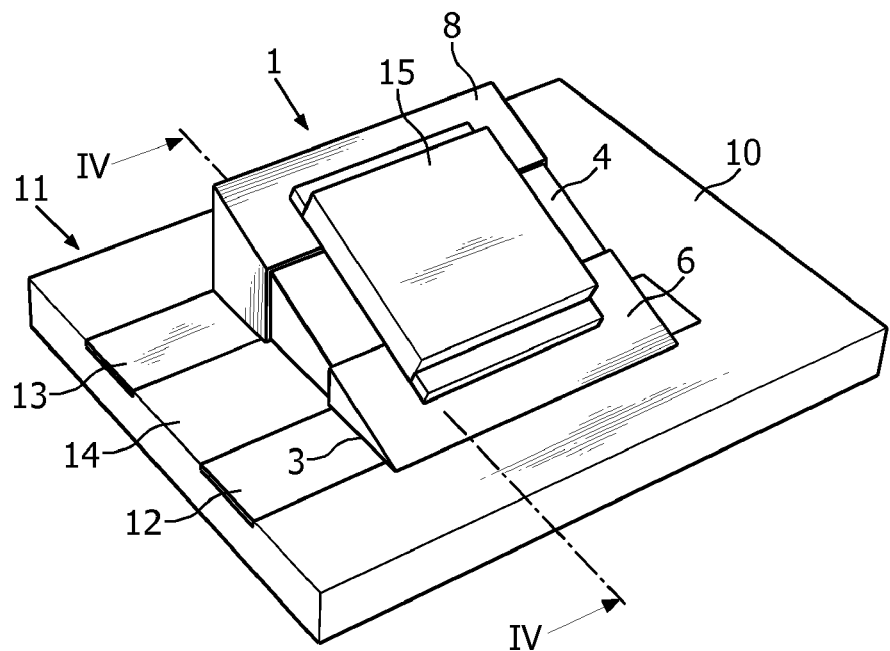
FIG. 3 is a perspective view and shows the supporting component mounted on a substrate.

FIG. 3 illustrates the situation when the supporting component 1 has been applied to a surface 10 of a substrate 11 in the form of a printed circuit board (PCB). A first substrate conductor 12 and a second substrate conductor 13 are provided on the surface 10 of the substrate 11. The substrate 11 has a portion 14 which is made of an isolating material and which isolates the conductors 12, 13 from each other. A surface mounted device (SMD) in the form of a light-emitting diode (LED) 15 is supported on the second surface 4 of the component 1.

Figure 4:
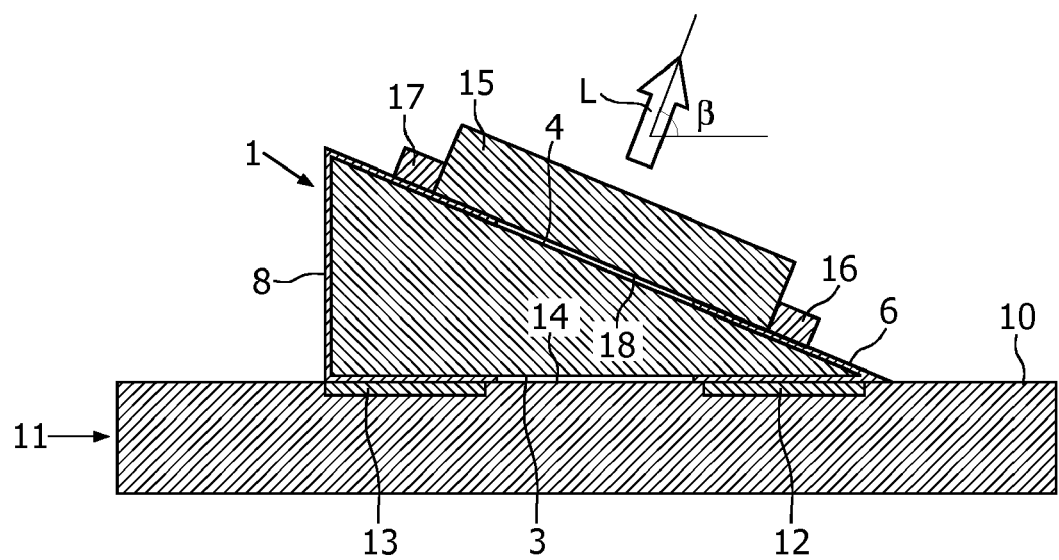
FIG. 4 is a cross-section view and shows the cross-section IV-IV of FIG. 3.

FIG. 4 illustrates the supporting component 1, the substrate 11 and the LED 15 as seen in the cross-section IV-IV of FIG. 3. As shown in FIG. 4 the first surface 3 of the component 1 faces the surface 10 of the substrate 11. The component 1 is located in such manner that the first substrate conductor 12 is in contact with the first supporting component conductor 6 at the first surface 3. Further the second substrate conductor 13 is in contact with the second supporting component conductor 8 at the first surface 3. The electrical contact between the substrate conductors 12, 13 and the respective supporting component conductor 6, 8 can be obtained by welding or soldering, by means of a conductive adhesive, such as a conductive glue, or by means of any other per se known method of achieving electrical contact between conductors.

The second surface 4 of the component 1 supports the LED 15. The LED 15 is provided with a first electrode 16 and a second electrode 17. The first electrode 16 is in contact with the first supporting component conductor 6 and the second electrode 17 is in contact with the second supporting component conductor 8. The electrical contact between the electrodes 16, 17 and the respective conductor 6, 8 may be obtained by welding, soldering, gluing, or another suitable known method. The lower portion 18 of the LED 15 has been made isolating to avoid short-circuiting the conductors 6, 8 at the second surface 4. It will be appreciated that the first electrode 16 is in contact with the first substrate conductor 12 via the conductor 6. Further the second electrode 17 is in contact with the second substrate conductor 13 via the conductor 8.

An arrow L illustrates, schematically, how light may be emitted at a desired angle β in relation to the surface 10 of the substrate 11. The supporting of the LED 15 on the component 1, which in turn is mounted on the substrate 11, will thus provide for a desired inclination of the LED 15 in relation to the substrate 11. At the same time the component 1 will provide for electrical connection between the substrate 11 and the LED 15. Thereby mounting and provision of electrical contact is provided simultaneously. Thus effective mounting of the LED 15 on the substrate 11 is provided for.

Figure 5:
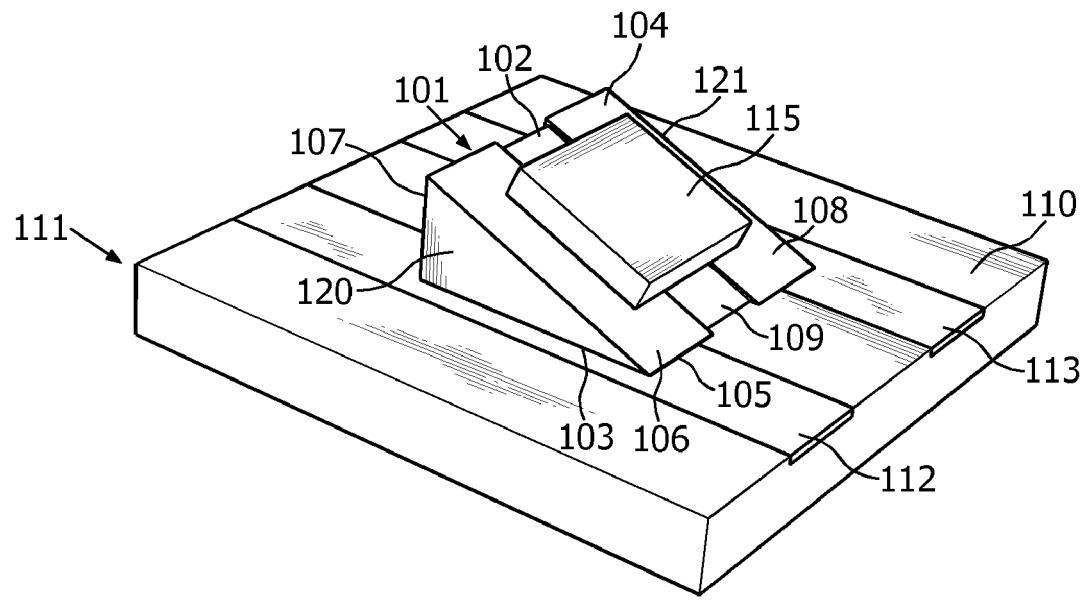
FIG. 5 is a perspective view and shows a supporting component according to a second embodiment of the invention.

FIG. 5 illustrates a supporting component 101 according to a second embodiment of the present invention. The component 101 has a wedge-shaped body 102 which has a first surface 103 and a second surface 104 which is inclined in relation to the first surface 103. As is shown in FIG. 5 the component 1 has a first supporting component conductor 106 which extends, at a first side 120 of the body 102, from a tip 105 to a thick end 107 of the wedge-shaped body 102. A second supporting component conductor 108 extends, at a second side 121 of the body 102, from the tip 105 to the thick end 107 of the wedge-shaped body 102. As is shown in FIG. 5 a portion 109 isolates the two conductors 106, 108 from each other. The first conductor 106 is in contact with a first substrate conductor 112, formed on a surface 110 of a substrate 111, and the second conductor 108 is in contact with a second substrate conductor 113 formed on the substrate 111. A LED 115 is in contact with the conductors 106, 108 according to similar principles as described above. The main difference between the supporting component 1 and the supporting component 101 is thus the location of the supporting component conductors.

Figure 6:
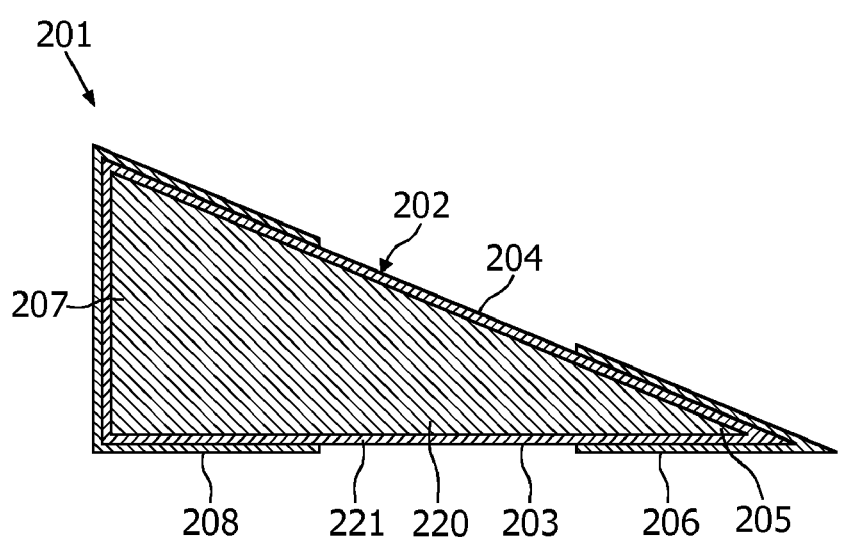
FIG. 6 is a cross-section view and shows a supporting component according to a third embodiment of the invention.

FIG. 6 illustrates a supporting component 201 according to a third embodiment of the present invention. The component 201 has a wedge-shaped body 202 which has a first surface 203 and a second surface 204 which is inclined in relation to the first surface 203. In addition to supporting a SMD and contacting it to a substrate the component 201 has the additional purpose of conducting heat from the SMD, such as a LED, to a substrate. Heat transport is of particular importance in the case of high-power SMD's, such as high-power LED's, to avoid the destruction of the SMD and/or the supporting component. To this end the body 202 of the supporting component 201 has a metal core 220. The metal core 220 could be an aluminium core. The metal core 220 is covered by a thin isolating layer 221, which may, for example, be made of alumina. The thin isolating layer 221 isolates a first supporting component conductor 206, which is located at a tip 205 of the wedge-shaped body 202, from a second supporting component conductor 208, which is located at a thick end 207 of the wedge-shaped body 202. The metal core 220 is efficient for transporting heat from a LED, not shown, supported at the second surface 204 to a substrate, not shown, at the first surface 203.

Figure 7:
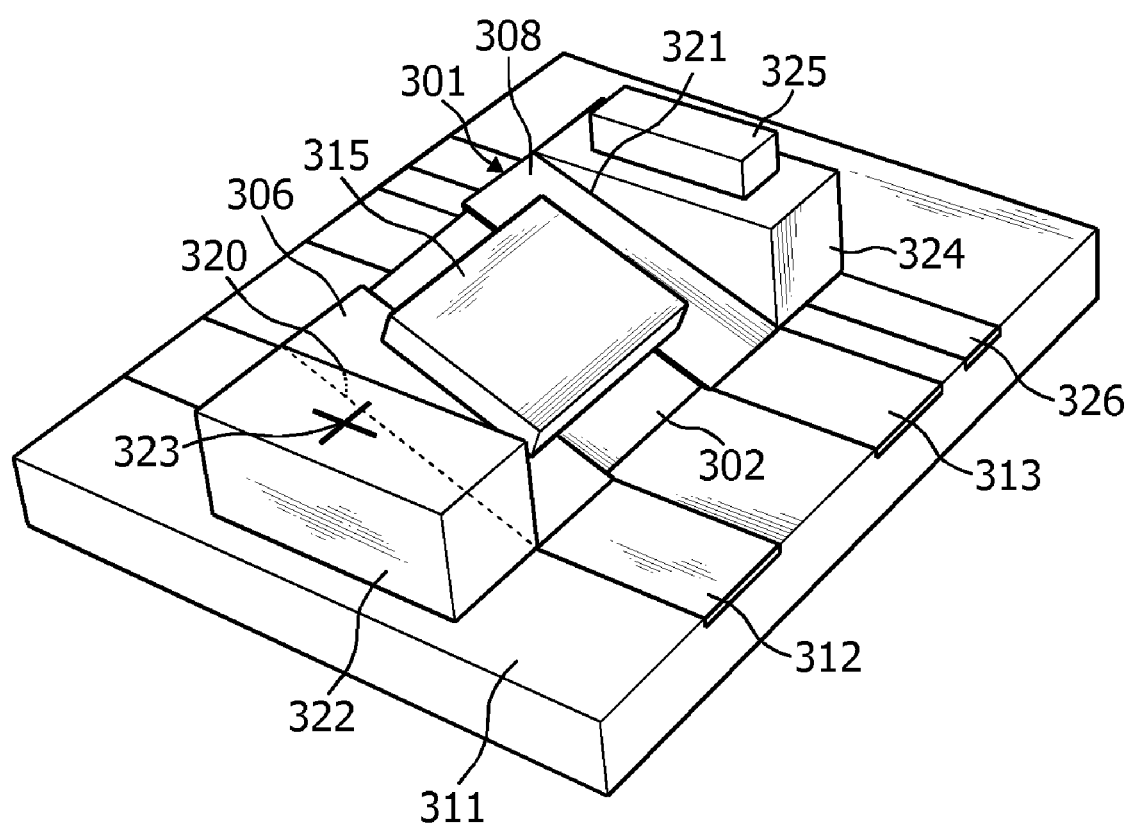
FIG. 7 is a perspective view and shows a supporting component according to a fourth embodiment of the invention.

FIG. 7 illustrates a supporting component 301 according to a fourth embodiment of the present invention. The supporting component 301 has a central body 302 which is quite similar to the body 2 described above. However the body 302 is provided, at a first side 320, with a protruding structure 322. The structure 322 contains a marker 323 which contains information about the supporting component 301 and/or a SMD 315 supported by it. In addition to carrying the marker 323 the protruding structure 322 may also be gripped by an automatic pick-and-place device. The latter device, which is per se known in the art of surface mounting to PCB's, is used for automatically mounting the supporting component 301 and the SMD 315 on a substrate 311.

On a second side 321 of the body 302 a device carrier 324 is located. The device carrier 324 supports an additional SMD 325. As shown in FIG. 7 a first supporting component conductor 306 and a second supporting component conductor 308 serves for forming electrical contact between the SMD 315 and first and second substrate conductors 312, 313, respectively, on the substrate 311. A third substrate conductor 326 being in electrical contact with the device carrier 324 may, together with the second substrate conductor 313, supply the additional SMD 325 with electric current.

It will be appreciated that numerous variants of the above-described embodiments are possible within the scope of the appended patent claims.

Above the it has been described that the second surface 4 is inclined in relation to the first surface 3, both surfaces 3, 4 being plane surfaces. It will be appreciated that the first and second surfaces could have other shapes and that the second surface could be inclined in relation to the first surface in other ways as well. For instance the second surface could be inclined in two directions in relation to the first surface.

As described above the supporting component supports one surface mounted device (SMD). A supporting component could also be designed to support several SMD's on its second surface, for instance to support an array or a group of SMD's.

In the description above it is described that the supporting component could be used for supporting different types of surface mounted devices, including light-emitting diodes (LED's). The supporting component is particularly useful for LED's since the direction of the light emitted is often an important characteristic of the LED. An example of an application where the supporting component is useful is when several LED's are mounted at different locations on a printed circuit board with the purpose of illuminating a common focal point, for example for the reason for coupling light from several LED's into one optical element, such as a lens or a mirror. An example of such an application is a head-light for use in automotive applications.

A further example of a type SMD's for which the present invention could be useful is photo-diodes. For instance in a Solid State Lighting (SSL) module a photo-diode, used in a feedback system, could be tilted to point in a certain direction in which the best possible measurement can be taken.

In addition to supporting the surface mounted device the supporting component could also be designed for supporting additional devices, such as primary or secondary optics of a light-emitting diode.

The supporting components 1, 101, 201 and 301 described above each has a first supporting component conductor and a second supporting component conductor. It will be appreciated that it is also possible to form a supporting component with a first supporting component conductor only. In such a case a conductor contacting the second electrode of the surface mounted device (SMD) with the substrate would need to be separately formed. Further, according to another embodiment, a supporting component could also be formed with three or more supporting component conductors, for instance for the purpose of supporting and contacting an SMD with more than two contacts, such as a package containing more than one (LED) die or a component with several contacts, or for the purpose of supporting and contacting several separate SMD's on one supporting component.

Above it has been described that the supporting component is mounted to the substrate and that the surface mounted device (SMD) is mounted on the supporting component. The order in which these working operations are performed is, however, not crucial. Thus it is possible to first apply the supporting component on the substrate and then apply the surface mounted device on the supporting component on the substrate. It is also possible to first mount the SMD on the supporting component and then locate the package comprising the SMD and the supporting component on the substrate. In many cases this later order of performing working operations, i.e. to first mount the SMD on the supporting component to form a prefabricated package, is preferred since fewer working operations need to be done at the substrate. It is further indicated above that the supporting component conductors are formed on the body prior to locating an SMD on the second surface. It is also possible, however, to first mount an SMD on the second surface of the body of a supporting component and to then form a first supporting component conductor in such manner that the conductor is, already when being formed, in electrical contact with the SMD.

As mentioned above the body of the supporting component could be made by extrusion of a suitable technical ceramic or another suitable material. For more complicated structures it is also possible to form the body by means of another per se known method, such as injection moulding, pressing, machining etc.

FIG. 6 illustrates an embodiment where a metal core is used for improving the heat transport. As alternative to using a thin alumina layer for isolation it is also possible to use isolating techniques known in the art of metal-core printed circuit boards. It is also possible to use non-metallic materials with a high thermal conductivity, for example AlN, as a core material. In the latter case, with non-metal materials, an isolating material might not be required.

As mentioned above a surface mounted device (such as a light-emitting diode) could, preferably, be welded, soldered, applied by means of a paste, or glued to the second surface of the supporting component. In all cases it is preferable that the fixing method provides for good electrical contact. Thus, for example, a conducting paste or a conducting glue could be used for to fix the SMD to the second surface and for to provide good electrical contact. In case the supporting component is supposed to have the additional function of transporting heat from the SMD to the substrate the way of fixing the supporting component to the substrate and to the SMD should be adapted for this purpose. In particular soldering, gluing with a thermally conductive glue, or fixing by means of a thermally conductive paste provide suitable ways of obtaining good heat transport from the SMD to the substrate via the supporting component.

In some cases a sub-module is suitably fitted between the supporting component and the SMD. The sub-module may work as an adapter between the wiring pattern of the SMD and the supporting component conductors. A still further possibility is to design the supporting component conductors with such a pattern that the supporting component itself works as an adapter between the wiring pattern of the SMD and the wiring pattern of the substrate.

To summarize a supporting component 1 adapted for being mounted on a substrate 11 and for serving as a support for a surface mounted device 15 comprises a body 2 having a first surface 3 adapted for being mounted on the substrate 11, and a second surface 4 being adapted for supporting the surface mounted device 15. The second surface 4 is inclined in relation to the first surface 3. The supporting component 1 further comprises a first supporting component conductor 6 adapted for forming an electrical contact between a first substrate conductor 12 of the substrate 11 and a first electrode 16 of the surface mounted device 15.

In a method of mounting a surface mounted device 15 in an inclined manner on a substrate 11 the supporting component 1 is mounted on the substrate 11 with the surface mounted device 15 on top of it.

The invention claimed is:

1. A supporting component adapted for being mounted on a substrate (11) and for serving as a support for a surface mounted device (15), the supporting component (1) comprising a body (2) having a first surface (3) adapted for being mounted on the substrate (11), and a second surface (4) being adapted for supporting the surface mounted device (15), the second surface (4) being inclined in relation to the first surface (3), the supporting component (1) further comprising a first supporting component conductor (6) adapted for forming an electrical contact between a first substrate conductor (12) of the substrate (11) and a first electrode (16) of the surface mounted device (15).

2. A supporting component according to claim 1, wherein the supporting component (1) further comprises a second supporting component conductor (8) adapted for forming an electrical contact between a second substrate conductor (13) of the substrate (11) and a second electrode (17) of the surface mounted device (15), the second supporting component conductor (8) being isolated from the first supporting component conductor (6).

3. A supporting component according to claim 2, wherein said body (2) comprises an isolating portion (9) isolating the first supporting component conductor (6) from the second supporting component conductor (8).

4. A supporting component according to claim 3, wherein said isolating portion (9) is made of an isolating material which forms a core (2) onto which said supporting component conductors (6, 8) have been formed.

5. A supporting component according to claim 1, wherein said body (2; 102) comprises a ceramic core.

6. A supporting component according to claim 1, wherein said body (202) comprises a metal core (220), the metal core (220) being at least partly covered by an isolating layer (221) isolating the first supporting component conductor (206) from said metal core (220).

7. A supporting component according to claim 1, wherein said first supporting component conductor (6) has been formed on the body (2) by structured metallisation.

8. A supporting component according to claim 1, wherein the supporting component (301) comprises a protruding structure (322) adapted for being gripped by an automatic pick-and-place device.

9. A printed circuit board comprising a substrate (11), a surface mounted device (15) and a supporting component (1) according to claim 1, the supporting component (1) being mounted on the substrate (11) with its first surface (3) facing the substrate (11) and with its second surface (4) supporting the surface mounted device (15), the first supporting component conductor (6) forming an electrical contact between a first substrate conductor (12) of the substrate (11) and a first electrode (16) of the surface mounted device (15).

10. A method of mounting a surface mounted device (15) on a substrate (11), the method comprising
   providing a supporting component (1) comprising a body (2) having a first surface (3) and a second surface (4), the second surface (4) being inclined in relation to the first surface (3), the supporting component (1) further comprising a first supporting component conductor (6) adapted for forming an electrical contact between a first substrate conductor (12) of the substrate (11) and a first electrode (16) of the surface mounted device (15), and
   applying, in optional order,
a) the supporting component (1) on the substrate (11) with the first surface (3) of the supporting component (1) facing the substrate (11) and with the first supporting component conductor (6) in contact with the first substrate conductor (12), and
b) the surface mounted device (15) on the second surface (4) of the supporting component (1) and with the first supporting component conductor (6) in contact with the first electrode (16) of the surface mounted device (15).

11. A method according to claim 10, wherein the applying of the surface mounted device (15) to the second surface (4) of the supporting component (1) is made prior to applying the supporting component (1), with the surface mounted device (15) applied thereon, on the substrate (11).

12. A method according to claim 10, wherein the supporting component (1) is fixed to the substrate (11) and to the surface mounted device (15) by means of a method chosen among soldering, welding, applying by means of a paste, and gluing.

* * * * *